(12) United States Patent
Savelli et al.

(10) Patent No.: US 10,038,133 B2
(45) Date of Patent: *Jul. 31, 2018

(54) DIFFERENTIAL TEMPERATURE SENSOR

(71) Applicants: COMMISSARIAT À L'ENERGIE ATOMIQUE ET AUX ENERGIES ALTERNATIVES, Paris (FR); HOTBLOCK ONBOARD, Grenoble (FR)

(72) Inventors: Guillaume Savelli, Seyssins (FR); Joël Dufourcq, Puyoo (FR)

(73) Assignees: COMMISSARIAT À L'ENERGIE ATOMIQUE ET AUX ENERGIES ALTERNATIVES, Paris (FR); HOTBLOCK ONBOARD, Grenoble (FR)

( * ) Notice: Subject to any disclaimer, the term of this patent is extended or adjusted under 35 U.S.C. 154(b) by 0 days.

This patent is subject to a terminal disclaimer.

(21) Appl. No.: 14/975,078

(22) Filed: Dec. 18, 2015

(65) Prior Publication Data

US 2016/0181502 A1    Jun. 23, 2016

(30) Foreign Application Priority Data

Dec. 19, 2014    (FR) ...................................... 14 62975

(51) Int. Cl.
*H01L 35/32*    (2006.01)
*H01L 35/04*    (2006.01)
(Continued)

(52) U.S. Cl.
CPC ................ *H01L 35/32* (2013.01); *G01K 1/18* (2013.01); *G01K 3/14* (2013.01); *G01K 7/028* (2013.01); *G01K 17/20* (2013.01); *H01L 35/04* (2013.01)

(58) Field of Classification Search
None
See application file for complete search history.

(56) References Cited

U.S. PATENT DOCUMENTS 7,875,791 B2 *    1/2011    Leonov ..................... G01J 5/12
                                                                    136/203
9,461,231 B2 *   10/2016    Savelli ..................... G01K 1/08
(Continued)

FOREIGN PATENT DOCUMENTS

EP    1976034 A2    10/2008
FR    2598803 A1    11/1987
(Continued)

*Primary Examiner* — Hoang-Quan Ho
(74) *Attorney, Agent, or Firm* — Oliff PLC

(57) ABSTRACT

Sensor including a substrate, an assembly of thermoelectric layers including at least one first and one second junction of a thermocouple, at least one first and one second connection pads arranged to transfer heat respectively to each first and each second junction, a support member (2) of the substrate (3) intended to be connected to the hot source (Sc) and to the cold source (Sf), first and second metal connectors arranged to electrically connect the support member (2) respectively to each first and each second connection pad, the support member (2) including a thermal conductor configured to transfer heat from the hot source (Sc) to the first metal connector, and to transfer heat from the second metal connector to the cold source (Sf).

13 Claims, 5 Drawing Sheets

(51) Int. Cl.
    *G01K 1/18*     (2006.01)
    *G01K 7/02*     (2006.01)
    *G01K 3/14*     (2006.01)
    *G01K 17/20*     (2006.01)

(56) References Cited

U.S. PATENT DOCUMENTS

| | | | |
|---|---|---|---|
| 2005/0034749 A1* | 2/2005 | Chen | G01J 5/02 |
| | | | 136/224 |
| 2006/0076046 A1 | 4/2006 | Ghoshal et al. | |
| 2008/0271772 A1* | 11/2008 | Leonov | G01J 5/12 |
| | | | 136/205 |
| 2010/0163090 A1* | 7/2010 | Liu | H01L 23/3675 |
| | | | 136/224 |
| 2013/0139524 A1* | 6/2013 | Kim | F25B 21/02 |
| | | | 62/3.7 |

FOREIGN PATENT DOCUMENTS

| | | |
|---|---|---|
| FR | 2955708 A1 | 7/2011 |
| WO | 8402037 A1 | 5/1984 |
| WO | 2007034048 A1 | 3/2007 |
| WO | 2011012586 A1 | 2/2011 |
| WO | 2013/007593 A1 | 1/2013 |

\* cited by examiner

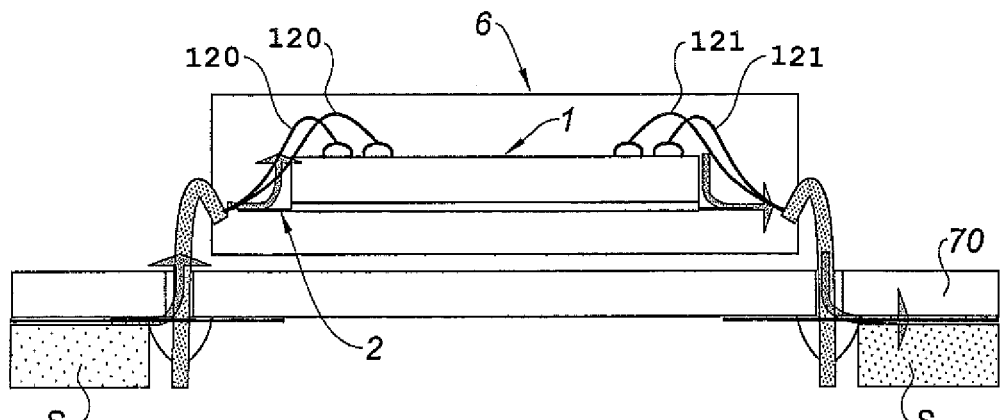
Fig. 12
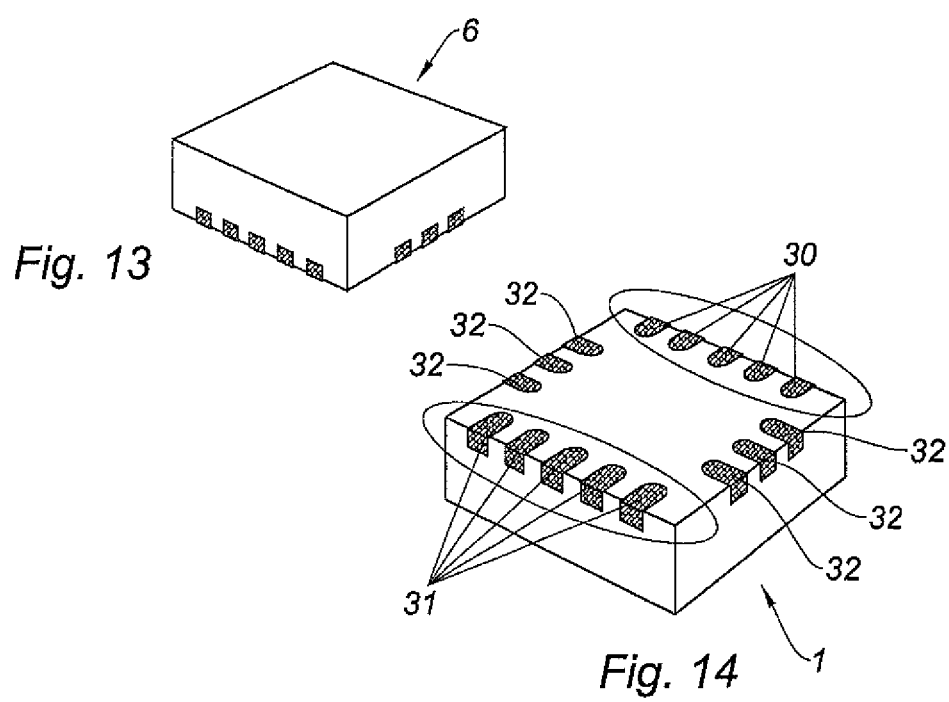
Fig. 13
Fig. 14

DIFFERENTIAL TEMPERATURE SENSOR

TECHNICAL FIELD

The present invention relates to a differential temperature sensor. More specifically, it is a Seebeck effect thermoelectric sensor.

BACKGROUND ART

As illustrated in FIG. 1, a known differential temperature sensor 1 between a hot source Sc and a cold source Sf of the state of the art comprises:

a substrate (not shown), preferably made of a silicon-based material, an assembly of thermoelectric layers arranged on the substrate separated by a thermally-insulating material 102, the assembly comprising at least one first junction 10 of a thermocouple 100, 101 on one side of the assembly, called hot side, and at least one second junction 11 of thermocouple 100, 101 on the opposite side of the assembly, called cold side, at least one first and one second connection pads (not shown) arranged to transfer heat respectively to each first junction 10 and to each second junction 11.

Terms "hot" and "cold" are to be understood in a relative meaning, that is, the temperature of the "hot" source is higher than the temperature of the "cold" source.

The connection pads are intended to be thermally connected to hot source Sc and to cold source Sf.

The assembly of thermoelectric layers comprises N thermocouples 100, 101, that is, N layers based on a first thermoelectric material 100 and N layers made of a second thermoelectric material 101. Each first junction 10 and each second junction 11 are formed with an electrically-conductive material.

Output voltage V generated by sensor 1 is provided by the following formula:

$$V = N \times (S_2 - S_1) \times (Tc - Tf), \text{ where:}$$

N is the number of thermocouples 100, 101, $S_1$ and $S_2$ respectively are the Seebeck coefficient of the first and second thermoelectric materials 100, 101, (Tc−Tf) is the thermal gradient applied between the hot side and the cold side of the assembly.

Such a sensor 1 of the state of the art forms a chip and falls within thin layer technologies, thus differing from macroscopic Seebeck effect thermoelectric sensors.

"Chip" means a wafer, preferably made of silicon, comprising an elementary component.

Such a sensor 1 of the state of the art is thus used in various applications where a miniaturization is desired. One can mention, as non-limiting examples, microelectronics, mobile telephony, smart homes, smart buildings, smart grids, certain industrial processes.

Currently, to achieve an electronic function, the integration of such a sensor 1 to other elementary components in a circuit is performed during the circuit manufacturing technological process. This solution is not satisfactory since it introduces complexity and multiple constraints for the execution of the method steps which have to take into account the influence of adjacent elementary components.

Further, the direct integration of such a sensor 1 in a package, for example, an integrated circuit package, causes significant heat losses which affect the thermal gradient applied between the hot side and the cold side of the assembly, thus preventing sensor 1 from operating properly.

SUMMARY OF THE INVENTION

The present invention aims at overcoming all or part of the above-mentioned disadvantages and relates for this purpose to a differential temperature sensor between a hot source and a cold source, the sensor comprising:

a substrate, an assembly of thermoelectric layers arranged on the substrate, the assembly comprising at least one first junction of a thermocouple on one side of the assembly, called hot side, and at least one second junction of the thermocouple on the opposite side of the assembly, called cold side, at least one first and one second connection pads arranged to transfer heat respectively to each first junction and to each second junction, the sensor being remarkable in that it comprises:

a thermally-insulating support member arranged to support the substrate, the support member being intended to be connected to the hot source and to the cold source, first and second metal connection means arranged to electrically connect the support member respectively to the or each first connection pad and the or each second connection pad, and in that the support member comprises heat transfer means arranged to transfer heat from the hot source to the first metal connection means, and to transfer heat from the second metal connection means to the cold source.

The connection of the support member to the hot and cold source may be direct, that is, the support member is in direct contact with said sources. The connection may be indirect, that is, the support member is thermally connected to said sources via a thermal path.

Thus, such a sensor according to the invention is integrated to the support member due to the first and second metal connection means. The metallic nature of the first and second connection means enables to provide both:

an electric connection of the support member to the connection pads, a good thermal conduction between the support member and the connection pads.

"Thermally insulating" means that the support member has a heat conductivity smaller than a value in the order of 150 W/m/K.

"Thermally conductive" means an entity having a heat conductivity greater than a value in the order of 150 W/m/K.

The support member is thermally insulating to avoid the forming of a thermal bridge between the first and second metal connection means via the support member. Thus, the thermal gradient between the hot source and the cold source may be transmitted between the first and second metal connection means, and thereby between the hot side and the cold side of the assembly of thermoelectric layers via the first and the second connection pads.

Further, thermal losses due to the integration are strongly decreased due to the heat transfer means of the support member and to the first and to the second metal connection means.

According to an embodiment, the first and the second connection means comprise a solder bump respectively soldered onto the or each first connection pad and onto the or each second connection pad to assemble the substrate and the support member.

Thus, such metallic solder bumps have excellent heat conduction properties.

According to an alternative execution, the first and the second metal connection means comprise a bonding wire respectively welded to the or each first connection pad and to the or each second connection pad to assemble the substrate and the support member.

According to an embodiment, the heat transfer means comprise at least one first and one second metal connector pins intended to be respectively connected to the hot source and to the cold source.

Thus, such metal connector pins enable to provide both:
an electric connection of the support member to, for example, an electronic board,
a good heat conduction between the hot and cold sources and the support member.

According to an embodiment, the heat transfer means comprise:
at least one first metal track connecting the first connection means to the or each first metal connector pin,
at least one second metal track connecting the second connection means to the or each second metal connector pin.

Thus, such metal tracks may have a pattern within the support member such as to:
avoid a thermal bridge between the hot side and the cold side of the assembly,
provide an electric connection,
provide a good thermal conduction between the metal connector pins and the corresponding connection means,
maintain a good mechanical behavior of the tracks.

According to an embodiment, the sensor comprises an integrated circuit package enclosing the assembly of thermoelectric layers, said package including the support member.

Thus, such a sensor according to the invention is directly integrated to the integrated circuit package. Further, an integrated circuit package conventionally comprises metal connector pins capable of being connected to the hot source and to the cold source. Further, an integrated circuit package enables to encapsulate the assembly of thermoelectric layers.

In an embodiment, the sensor comprises an additional package enclosing the integrated circuit package, the additional package comprising:
a first surface and a second opposite surface, preferably coated with a thermally-conductive material, the first and second surfaces being intended to be respectively connected to the hot source and to the cold source,
a first via, preferably metallic, connecting the first surface to each first connector pin,
a second via, preferably metallic, connecting the second surface to each second connector pin.

Non-integrated planar sensors capable of measuring the temperature of a flow orthogonal to the substrate are known in the state of the art, particularly from documents WO 2007034048, FR 2955708, WO 8402037, and FR 2598803. Thus, such an additional package according to the invention enables to measure temperature when the hot and cold sources are arranged on either side of the integrated circuit package in a plane orthogonal to the substrate, and this while keeping an integrated sensor-chip. The thickness and the first and second surfaces of the additional package are adapted to the distance separating the hot and cold sources, while the dimensions of the integrated circuit package can be fixed. The surfaces made thermally conductive and the vias transfer the heat between the hot and cold sources and the integrated circuit package.

Advantageously, the additional package comprises a support member arranged to support the integrated circuit package.

Thus, the support member of the additional package enables to improve the mechanical behavior of the sensor.

Advantageously, the integrated circuit package comprises at least one electric connector pin, and the additional package comprises at least one electric track extending from the electric connector pin.

Thus, such an electric track enables to define an electric output for the additional package.

According to an alternative execution, the sensor comprises an encapsulation layer arranged on the support member to encapsulate the assembly of thermoelectric layers, the encapsulation layer being preferably made of a material based on a polymer.

Advantageously, the assembly of thermoelectric layers has a free surface, and the sensor comprises a first and a second thermally-conductive elements facing said free surface and extending at a distance from said free surface, and respectively continuing said assembly on the hot side and on the cold side.

Thus, such thermally-conductive elements enable to homogenize the heat transfer between the hot side and the cold side of the assembly of thermoelectric layers.

Advantageously, the sensor comprises a dielectric layer interposed between the substrate and the assembly of thermoelectric layers.

Thus, such a dielectric layer enables to electrically and thermally insulate the substrate.

According to an embodiment, the substrate is made of a silicon-based material.

According to an alternative execution, the substrate is made of a thermally-insulating material, such as glass or quartz.

BRIEF DESCRIPTION OF THE DRAWINGS

The foregoing and other features and advantages will be discussed in detail in the following non-limiting description of different embodiments of a sensor according to the invention, in connection with the accompanying drawings, among which:

FIG. 8 is a simplified top view of a sensor according to an embodiment of the invention, FIG. 9 is a partial simplified side view of the embodiment illustrated in FIG. 8, FIGS. 10 and 11 are simplified top views of a sensor according to the invention illustrating two types of connection to the hot and cold sources, FIG. 12 is a simplified side view of a sensor according to an embodiment of the invention, FIG. 13 is a simplified perspective view of an integrated circuit package capable of integrating a sensor according to the invention, FIG. 14 is a simplified perspective view of the flipped package illustrated in FIG. 13.

For the different embodiments, the same references will be used for identical elements or elements performing the same function, to simplify the description.

DETAILED DESCRIPTION OF THE EMBODIMENTS

Figure 1:
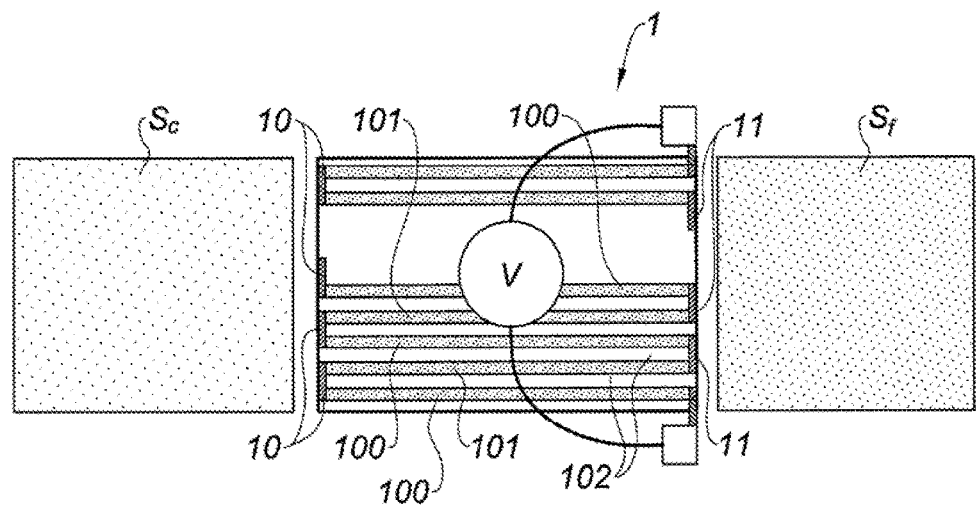
FIG. 1 is a simplified top view of a sensor of the state of the art (already discussed)

FIGS. 2 to 12 illustrate a differential temperature sensor 1 between a hot source Sc and a cold source Sf, sensor 1 comprising:

a substrate 3 (shown in FIG. 9),
an assembly E of thermoelectric layers 100, 101 arranged on substrate 3 (assembly E and substrate 3 being schematically shown with a rectangle in FIGS. 2 to 7), assembly E comprising at least one first junction of a thermocouple 100, 101 on one side of assembly E, called hot side, and at least one second junction of thermocouple 100, 101 on the opposite side of assembly E, called cold side, thermoelectric layers 100, 101 being separated by a thermally-insulating material 102,
at least one first and one second connection pads 50, 51 arranged to transfer heat respectively to each first junction and to each second junction.

Terms "hot" and "cold" are to be understood in a relative meaning, that is, the temperature of the "hot" source is higher than the temperature of the "cold" source.

Such a sensor 1 forms a chip, that is, a substrate-forming wafer, preferably made of a silicon-based material, comprising an elementary component.

Hereafter, the structure formed by substrate 3, assembly E of thermoelectric layers, and connection pads 50, 51 will be called "sensor-chip".

Substrate 3 is advantageously planar. Substrate 3 advantageously has a thickness in the range from 100 to 200 µm to limit the heat transfer to substrate 3. Further, the direction extending across the thickness of substrate 3 is called "first direction".

The assembly of thermoelectric layers comprises N thermocouples 100, 101, that is, N layers based on a first thermoelectric material 100 and N layers based on a second thermoelectric material 101. First thermoelectric material 100 is advantageously electrically doped according to a first conductivity type. Second thermoelectric material 101 is advantageously doped according to a second conductivity type. Each first junction 10 and each second junction 11 are formed with an electrically-conductive material. The N thermocouples 100, 101 and thermally-insulating material 102 are juxtaposed along a direction perpendicular to the first direction.

Sensor 1 comprises a support member 2 arranged to support the substrate. Support member 2 is intended to be directly or indirectly connected to hot source Sc and to cold source Sf Support member 2 is made of a thermally-insulating material.

Sensor 1 comprises first and second metal connection means arranged to electrically connect support member 2 respectively to the or each first connection pad 50 and to the or each second connection pad 51. First metal connection means include a first metal connector configured to electrically connect support member 2 to the at least one first connection pad 50. Second metal connection means include a second metal connector configured to electrically connect support member 2 to the at least one second connection pad 51.

Support member 2 comprises heat transfer means arranged to transfer heat from hot source Sc to the first metal connection means, and to transfer heat from the second metal connection means to cold source Sf. Heat transfer means include a first thermal conductor configured to transfer heat from the hot source to the first metal connector. Heat transfer means include a second thermal conductor configured to transfer heat from the second metal connector to the cold source.

In an embodiment, the first metal connection means comprise a solder bump 20 soldered to each first connection pad 50. The second metal connection means comprise a solder bump 21 soldered to each second connection pad 51.

Solder bumps 20, 21 further enable to assemble substrate 3 and support member 2. For this purpose, sensor 1 may comprise additional solder bumps 22 (shown in FIG. 6) which are not electrically connected to connection pads 50, 51 but contribute to assembling substrate 3 with support member 2 to improve the mechanical behavior. Solder bumps 20, 21, 22 are preferably based on a material selected from the group comprising Au, SnAgAu, SnAgCu. Solder bumps 20, 21, 22 advantageously have a diameter in the order of 80 µm for a thickness in the order of 80 µm. Such dimensions enable to associate compactness and a sufficient heat transfer surface area for the functionality of sensor 1. Of course, the diameter and the thickness of solder bumps 20, 21, 22 may vary, for example, from a few tens to a few hundreds of micrometers.

According to an alternative embodiment illustrated in FIG. 12, the first and the second connection means comprise a bonding wire 120, 121 respectively welded to the or each first connection pad 50 and to the or each second connection pad 51 to assemble substrate 3 and support member 2.

In an embodiment, the heat transfer means comprise:
first metal connector pins 30 connected to hot source Sc,
second metal connector pins 31 connected to cold source Sf.

Figure 2:
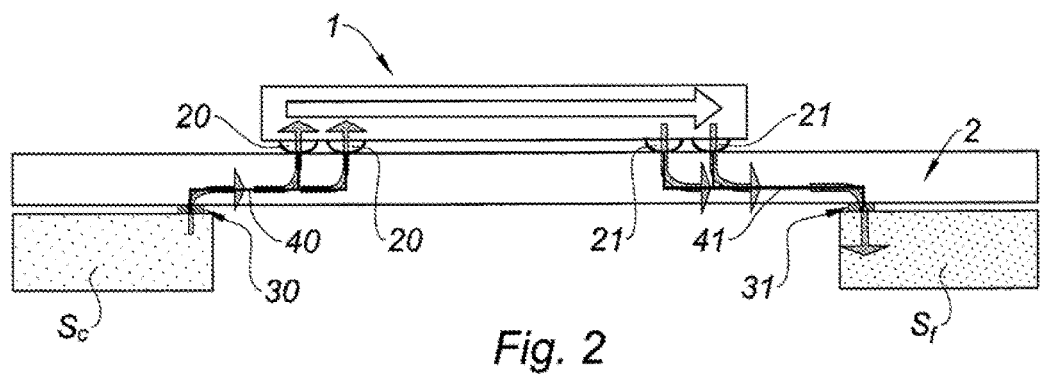
FIGS. 2 to 7 are simplified side views of a sensor according to different embodiments of the invention.
Figure 3:
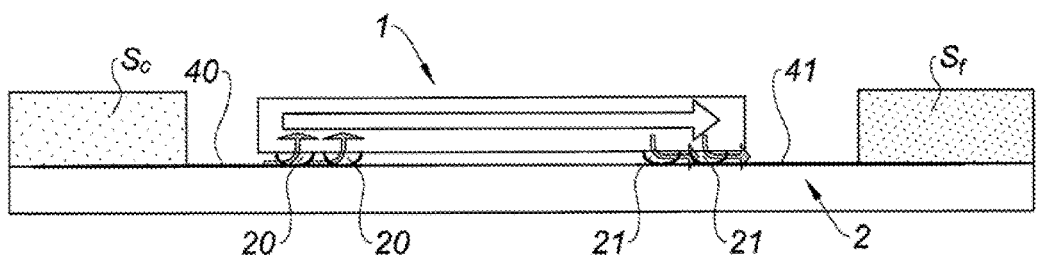
Figure 4:
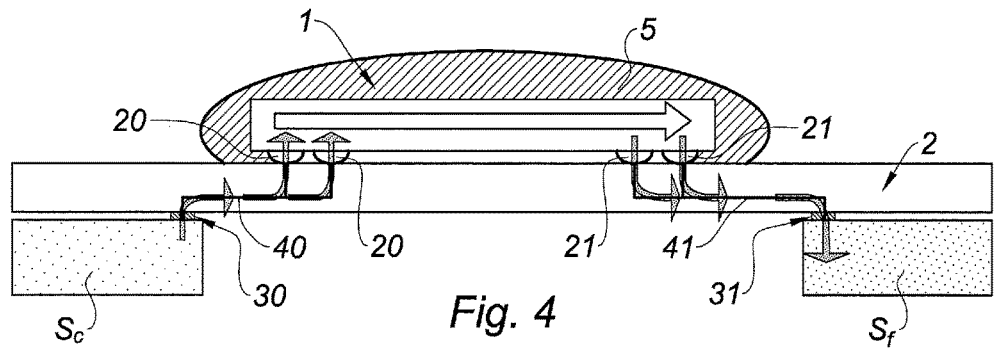
Figure 5:
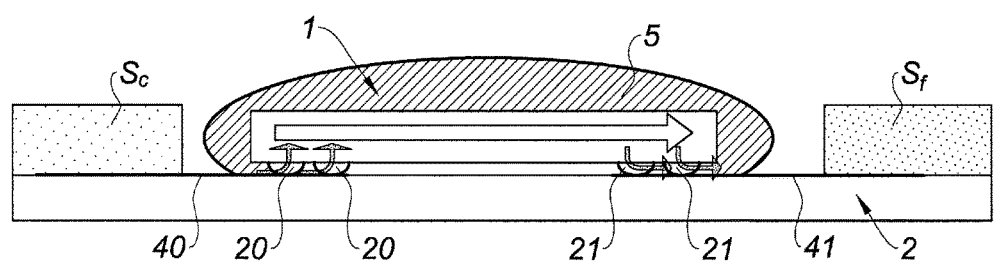

Hot source Sc and cold source Sf may be arranged on support member 2 (FIGS. 3 and 5). Hot source Sc and cold source Sf may be arranged under support member 2 (FIGS. 2 and 4).

In an embodiment, the heat transfer means further comprise:
first metal tracks 40 connecting solder bumps 20 to first connector pins 30,
second metal tracks 41 connecting solder bumps 21 to second connector pins 31.

The arrows indicate the direction of the heat transfer within sensor 1. Metal tracks 40, 41 may be formed at the surface of support member 2 when hot source
Sc and cold source Sf are arranged on support member 2 (FIGS. 3 and 5). Metal tracks 40, 41 may be formed through support member 2 when hot source Sc and cold source Sf are arranged under support member 2 (FIGS. 2 and 4). Such metal tracks 40, 41 may have a pattern within support member 2 such as to:
avoid a thermal bridge between the hot side and the cold side of assembly E,
provide an electric connection,
provide a good thermal connection between connector pins 30, 31 and solder bumps 20, 21,
preserve a good mechanical behavior of the tracks.

To achieve this, as a non-limiting example, such metal tracks 40, 41 may have a thickness in the order of a few tens of nm for a thickness of support member 2 in the order of 100 nm.

In the embodiments illustrated in FIGS. 2 to 5, support member 2 may be a transfer substrate adapted to transfer the sensor-chip. As illustrated in FIGS. 4 and 5, the sensor-chip may be encapsulated by means of an encapsulation layer 5 arranged on support member 2 to encapsulate assembly E. Encapsulation layer 5 is based on a thermally-insulating material. Encapsulation layer 5 is preferably made of a polymer-based material.

Figure 6:
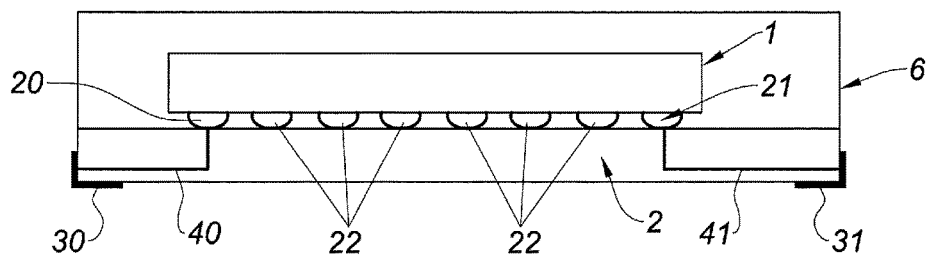
Figure 7:
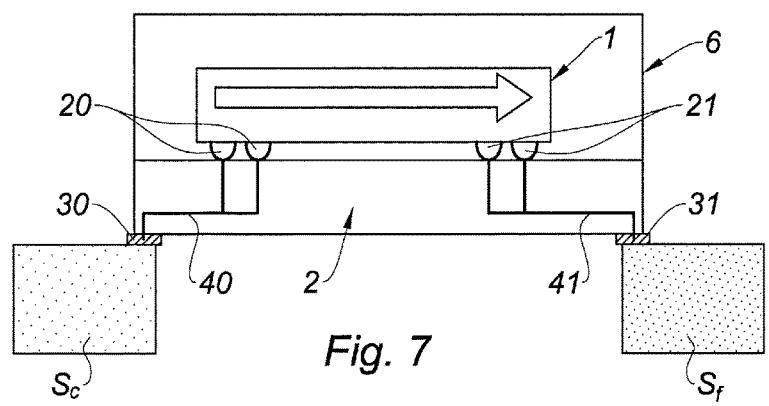
Figure 10:
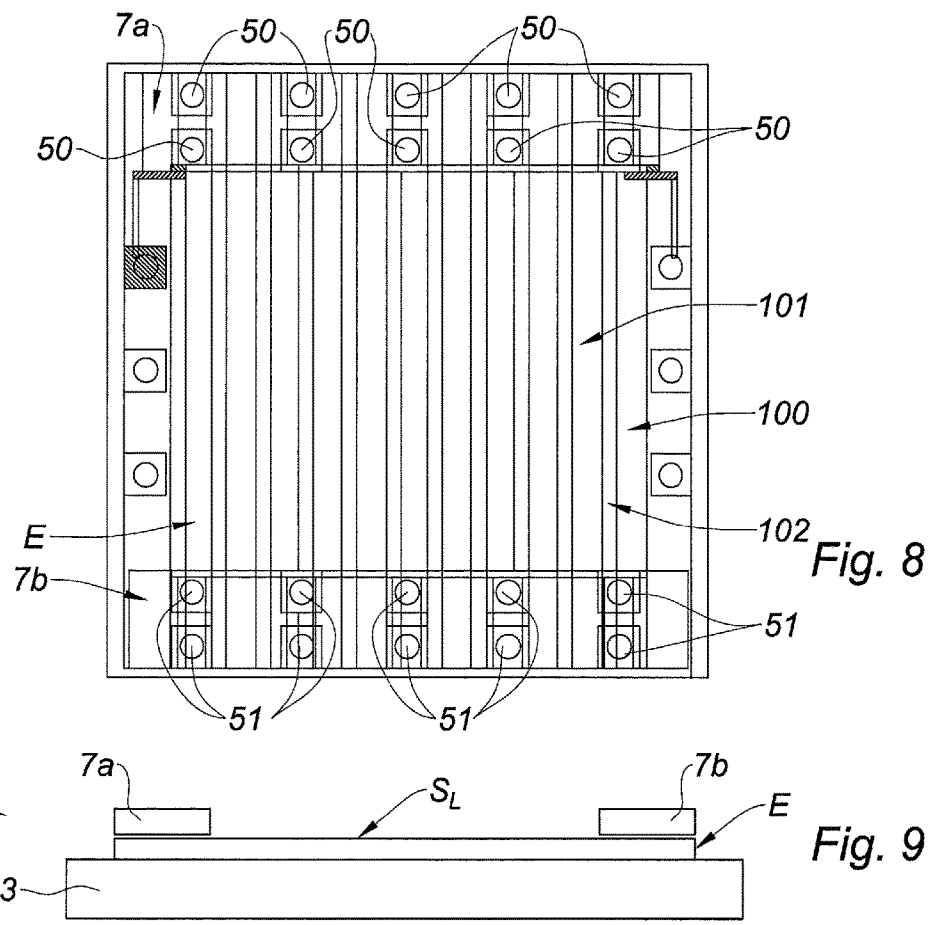
Figure 11:
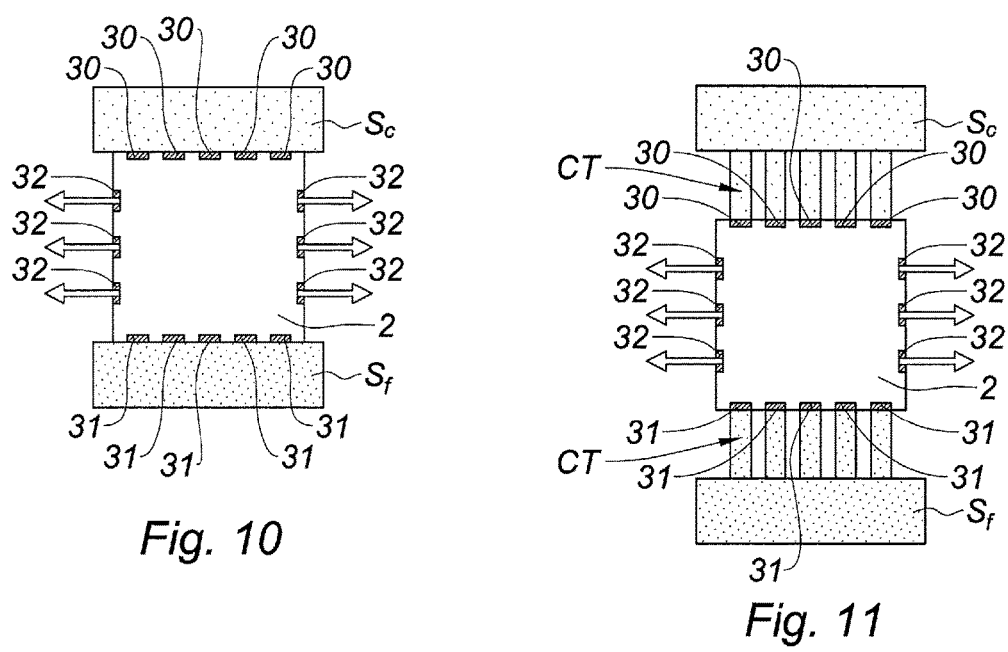

In an embodiment illustrated, in particular, in FIGS. 6 and 7, support member 2 belongs to an integrated circuit package 6. First and second connector pins 30, 31 equip package 6. As a non-limiting example, package 6 may be of SMD type (Surface Mounted Device). Package 6 is preferably made of a thermally-insulating material. Package 6 preferably has a thickness in the range from 0.1 to a few mm. Package 6 preferably has no central metallic surface conventionally used as a heat sink to avoid adversely affecting the heat transfer between package 6 and the sensor-chip.

As illustrated in FIG. 14, package 6 comprises:
- a row of first metal connector pins 30 intended to be connected to hot source Sc, and connected to first metal tracks 40,
- a row of second metal connector pins 31 intended to be connected to cold source Sf, and connected to second metal tracks 41.

The rows of connector pins 30, 31 may be continuous to form bars.

The connection may be direct, that is, connector pins 30, 31 are respectively in direct contact with hot source Sc and cold source Sf. The connection may be indirect, that is, connector pins 30, 31 are thermally connected to said sources via a thermal path CT.

First connector pins 30 form heat transfer means arranged to transfer the heat from hot source Sc to first metal tracks 40. Second connector pins 31 form heat transfer means arranged to transfer the heat from second metal tracks 41 to cold source Sf.

Package 6 comprises rows of additional metal connector pins 32 which are not used as heat transfer means. Additional metal connector pins 32 are used as simple electric connectors. The sensor-chip may comprise electric connection pads electrically connected to each first junction and to each second junction. Connector pins 32 may be electrically connected to said electric connection pads. It will be within the abilities of those skilled in the art to select different layouts for the connector pins 30, 31 used as heat transfer means, and for the connector pins 32 used as electric connectors. The different layouts will be selected, in particular, according to the envisaged application, to the positioning of hot and cold sources Sc, Sf and of the connector elements for the integration of the sensor-chip. It is also possible to use at least one metal connector pin both as an electric connector and as heat transfer means.

Substrate 3 and support member 2 belonging to package 6 are advantageously assembled by the flip-chip method, known by those skilled in the art, when the metal connection means comprise solder bumps 20, 21, 22.

Substrate 3 and support member 2 belonging to package 6 are advantageously assembled by the wire bonding method, known by those skilled in the art, when the metal connection means comprise welded bonding wires 120, 121 (FIG. 12).

As illustrated in FIG. 12, package 6 may be connected to an electronic board 70, for example, of IMS type (Insulated Metal Substrate). Hot and cold sources Sc, Sf are arranged at the back of electronic board 70 and are thermally connected to welded bonding wires 120, 121.

Figure 15:
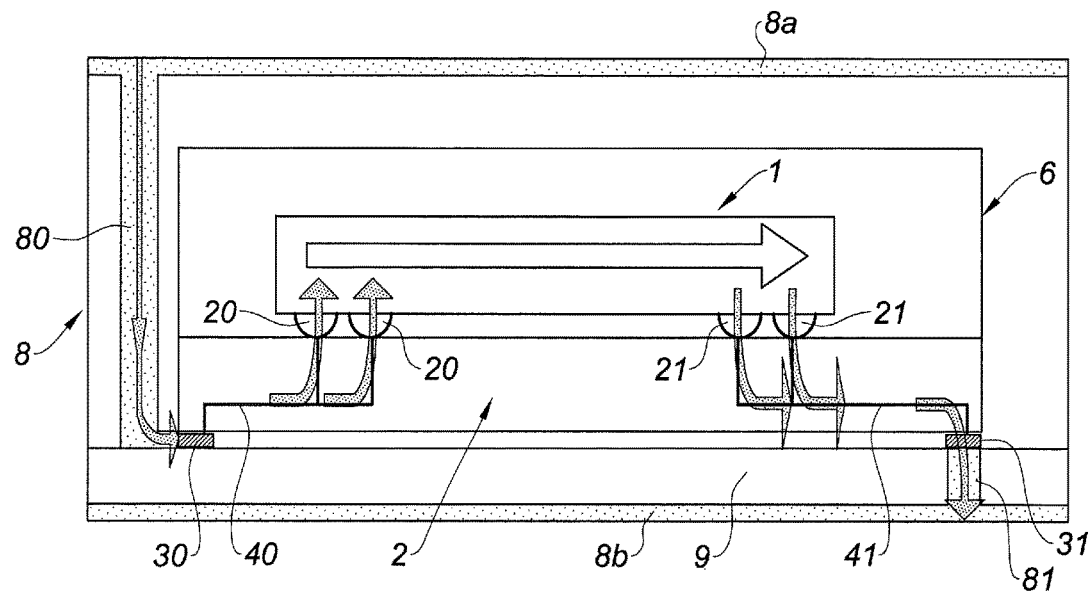
FIG. 15 is a simplified view of a sensor according to an embodiment of the invention.
Figure 16:
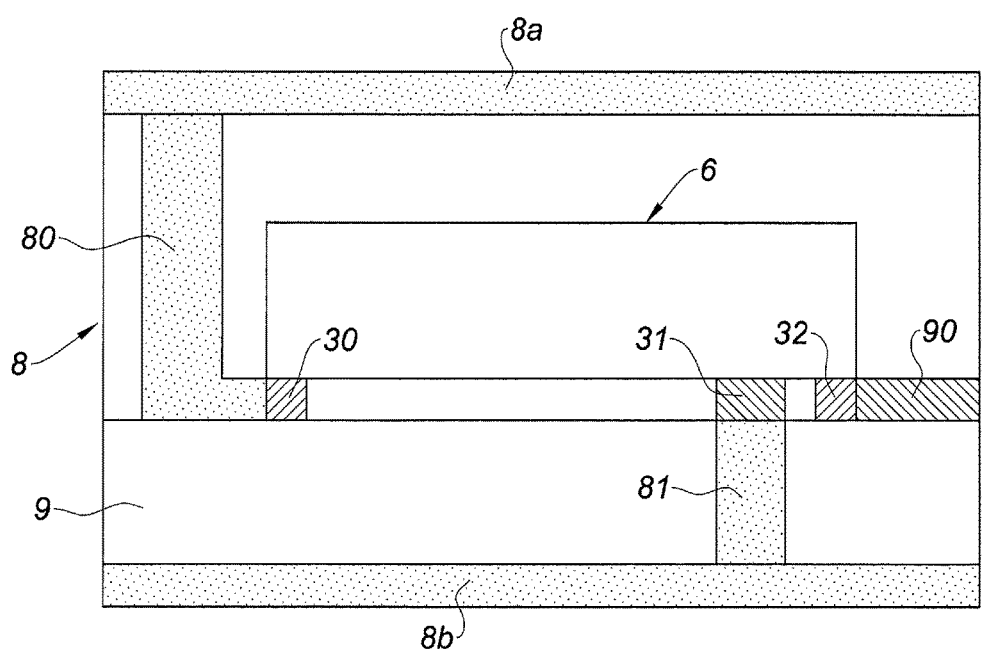
FIG. 16 is a simplified side view of a sensor according to an embodiment of the invention.

In an embodiment illustrated in FIGS. 15 and 16, sensor 1 comprises an additional package 8 enclosing integrated circuit package 6, additional package 8 comprising:
- a first surface 8a and a second opposite surface 8b, preferably coated with a thermally-conductive material, the first and second surfaces being intended to be respectively connected to hot source Sc and to cold source Sf,
- a first via 80, preferably metallic, connecting first surface 8a to each first connector pin 30,
- a second via 81, preferably metallic, connecting second surface 8b to each second connector pin 31.

Additional package 8 is preferably made of a thermally-insulating material. Surfaces 8a, 8b are made thermally conductive preferably by means of a coating based on a thermally-conductive material. The thermally-conductive material of the coating may be a metal such as Cu, Au, Ag, or an alloy based on silver, or a material selected from the group comprising anodized Al, SiC, AlN. The thermally-conductive material of the coating may be deposited on additional package 8 according to different techniques such as chemical vapor deposition (CVD) or physical vapor deposition (PVD). The thermally-conductive material of the coating may be directly welded or soldered to additional package 8.

Vias 80, 81 may have different shapes. Vias 80, 81 may be one-piece or formed in a plurality of wells. Vias 80, 81 may be directly connected to connector pins 30, 31 or indirectly connected thereto via metal tracks.

Additional package 8 advantageously comprises a support member 9 arranged to support integrated circuit package 6 within additional package 8. Integrated circuit package 6 is advantageously fastened to support member 9 of additional package 8 by gluing, soldering, or welding. Support member 9 of additional package 8 comprises ports formed therein to receive second vias 81. Additional package 8 is advantageously made of a thermally-insulating material to avoid the forming of a thermal bridge between first via 80 and second via 81 via support member 9 of additional package 8. Thus, the thermal gradient between hot source Sc and cold source Sf may be transmitted between each first connector pin 30 and each second connector pin 31, and thereby between the hot side and the cold side of assembly E of thermoelectric layers. The enclosure defined by additional package 8 may advantageously be placed under vacuum to concentrate the heat transfer on vias 80, 81.

Since first via 80 may be close to cold source Sf, it is necessary to properly geometrically configure first via 80 as well as support member 9 of additional package 8. To achieve this, the following equation should be verified:

$$\phi = \frac{e_{supp} \times \lambda_{via} \times S_{via}}{\lambda_{supp} \times S_{supp} \times e_{via}} \gg 1$$

where:

$e_{supp}$ is the thickness of support member 9 of additional package 8, $e_{via}$ is the thickness of first via 80, $\lambda_{supp}$ is the thermal conductivity of support member 9 of additional package 8, $\lambda_{via}$ is the thermal conductivity of first via 80, $S_{supp}$ is the lateral thermal conduction surface area of support member 9 of additional package 8, $S_{via}$ is the lateral thermal conduction surface area of first via 80.

"Lateral" means a direction parallel to the first direction, that is, the direction extending across the thickness of substrate 3.

As a non-limiting example, the following table gathers parameters enabling to properly geometrically configure first via 80 as well as support member 9 of additional package 8:

| Parameter | |
|---|---|
| $e_{supp}$ | 200 μm |
| $e_{via}$ | 700 μm |
| $\lambda_{supp}$ | 0.2 W/m/K (epoxy resin) |

| Parameter | |
|---|---|
| $\lambda_{via}$ | 386 W/m/K (Cu) |
| $S_{supp}$ | 5 × 5 mm² |
| $S_{via}$ | 3 × 1 mm² |
| $\Phi$ | 66 |

Integrated circuit package 6 advantageously comprises at least one electric connector pin 32 which is not used as heat transfer means. Additional package 8 advantageously comprises at least one electric track 90 extending from electric connector pin 32. It will be within the abilities of those skilled in the art to select different layouts for electric connector pins 32, particularly according to the envisaged application, and to the positioning of hot and cold sources Sc, Sf. Thus, it will be within the abilities of those skilled in the art to select different layouts for electric tracks 90 according to the layouts of said electric connector pins 32 to define different positions of electric outputs for additional package 8. The or each electric track 90 is advantageously formed in support member 9 of additional package 8.

In the embodiment illustrated in FIGS. 8 and 9, assembly E of thermoelectric layers has a free surface $S_L$, the sensor comprises a first and a second thermally conductive elements 7a, 7b facing said free surface $S_L$ and extending at a distance from said free surface $S_L$, and respectively continuing said assembly E on the hot side and on the cold side. In other words, the first and second thermally-conductive elements 7a, 7b top lateral areas of free surface $S_L$ with no direct contact. The first and second thermally-conductive elements 7a, 7b may be made of any thermally-conductive material, as described in document WO 2011012586. The first and second thermally-conductive elements 7a, 7b are advantageously metallic. First and second thermally-conductive elements 7a, 7b are advantageously made in the form of a metal strip.

In an embodiment, sensor 1 comprises a dielectric layer interposed between substrate 3 and assembly E of thermoelectric layers. When substrate 3 is made of a silicon-based material, the dielectric layer is advantageously $SiO_2$ or $Si_3N_4$. The dielectric layer has a thickness in the range from a few nm to several hundreds of μm.

The invention claimed is:

1. A differential temperature sensor between a hot source and a cold source, including:
    a substrate;
    an assembly of thermoelectric layers arranged on the substrate, the assembly including at least one first junction of a thermocouple on one side of the assembly, called hot side, and at least one second junction of the thermocouple on an opposite side of the assembly, called cold side;
    at least one first connection pad and at least one second connection pad configured to transfer heat respectively to the at least one first junction and to the at least one second junction;
    a thermally-insulating support member configured to support the substrate, said support member being intended to be connected to the hot source and to the cold source;
    a first metal connector and a second metal connector configured to electrically connect said support member respectively to the at least one first connection pad and to the at least one second connection pad;
    wherein said support member includes:
    a first thermal conductor configured to transfer heat from the hot source to the first metal connector, and
    a second thermal conductor configured to transfer heat from the second metal connector to the cold source.

2. The sensor according to claim 1, wherein the first metal connector and the second metal connector include a solder bump respectively soldered onto the at least one first connection pad and onto the at least one second connection pad to assemble the substrate and said support member.

3. The sensor according to claim 1, wherein the first metal connector and the second metal connector include a bonding wire respectively welded to the at least one first connection pad and to the at least one second connection pad to assemble the substrate and said support member.

4. The sensor according to claim 1, wherein the first and the second thermal conductors respectively include at least a first metal connector pin and at least a second metal connector pin intended to be respectively connected to the hot source and to the cold source.

5. The sensor according to claim 4, wherein the first and the second thermal conductors respectively include:
    at least one first metal track connecting the first metal connector to the at least one first metal connector pin; and
    at least one second metal track connecting the second metal connector to the at least second metal connector pin.

6. The sensor according to claim 1, including an integrated circuit package enclosing the assembly of thermoelectric layers, the integrated circuit package including said support member.

7. The sensor according to claim 6, wherein the first and the second thermal conductors respectively include at least a first metal connector pin and at least a second metal connector pin intended to be respectively connected to the hot source and to the cold source; the sensor further including an additional package enclosing the integrated circuit package, the additional package including:
    a first surface and a second opposite surface being intended to be respectively connected to the hot source and to the cold source,
    a first via connecting the first surface the at least one first metal connector pin,
    a second via connecting the second surface to the at least one second metal connector pin.

8. The sensor according to claim 7, wherein the additional package includes a support member configured to support the integrated circuit package.

9. The sensor according to claim 7, wherein the integrated circuit package includes at least one electric connector pin, and wherein the additional package includes at least one electric track extending from the at least one electric connector pin.

10. The sensor according to claim 1, including an encapsulation layer configured on the support member to encapsulate the assembly of thermoelectric layers.

11. The sensor according to claim 1, wherein the assembly of thermoelectric layers has a free surface, wherein the sensor includes a first and a second thermally-conductive elements facing said free surface and extending at a distance from said free surface, and respectively continuing said assembly on the hot side and on the cold side.

12. The sensor according to claim 1, including a dielectric layer interposed between the substrate and the assembly of thermoelectric layers.

13. The sensor according to claim 1, wherein the thermally-insulating support member comprises first and second metal tracks, wherein the first and second metal tracks form the first and second connection pads, respectively.

* * * * *